(12) United States Patent
Zhang et al.

(10) Patent No.: US 11,609,618 B2
(45) Date of Patent: Mar. 21, 2023

(54) DISPLAY MOTHERBOARD AND MANUFACTURING METHOD THEREOF

(71) Applicants: ORDOS YUANSHENG OPTOELECTRONICS CO., LTD., Inner Mongolia (CN); BOE TECHNOLOGY GROUP CO., LTD., Beijing (CN)

(72) Inventors: Xueyong Zhang, Beijing (CN); Shixin Ruan, Beijing (CN); Wu Wang, Beijing (CN); Xiaocui Yang, Beijing (CN)

(73) Assignees: ORDOS YUANSHENG OPTOELECTRONICS CO., LTD., Inner Mongolia (CN); BOE TECHNOLOGY GROUP CO., LTD., Beijing (CN)

( * ) Notice: Subject to any disclaimer, the term of this patent is extended or adjusted under 35 U.S.C. 154(b) by 301 days.

(21) Appl. No.: 16/955,632

(22) PCT Filed: Jun. 10, 2019

(86) PCT No.: PCT/CN2019/090545
§ 371 (c)(1),
(2) Date: Jun. 18, 2020

(87) PCT Pub. No.: WO2019/238005
PCT Pub. Date: Dec. 19, 2019

(65) Prior Publication Data
US 2021/0004062 A1  Jan. 7, 2021

(30) Foreign Application Priority Data
Jun. 11, 2018  (CN) .......................... 201810597137.8

(51) Int. Cl.
*G06F 1/18* (2006.01)
*H01L 51/52* (2006.01)
*H01L 51/56* (2006.01)

(52) U.S. Cl.
CPC ............ *G06F 1/184* (2013.01); *H01L 51/525* (2013.01); *H01L 51/56* (2013.01)

(58) Field of Classification Search
CPC ... H01L 51/525; H01L 51/56; H01L 51/0024; H01L 51/5246; H01L 2251/566; G06F 1/184
See application file for complete search history.

(56) References Cited

U.S. PATENT DOCUMENTS

2009/0009046 A1   1/2009  Oh et al.
2015/0102304 A1*  4/2015  Go ..................... H01L 51/5246
                                                            438/33
(Continued)

FOREIGN PATENT DOCUMENTS

CN   101335291 A   12/2008
CN   104124268 A   10/2014
(Continued)

OTHER PUBLICATIONS

International Search Report and Written Opinion for Application No. PCT/CN2019/090545, dated Sep. 9, 2019, 9 Pages.

*Primary Examiner* — Kevin Quarterman
(74) *Attorney, Agent, or Firm* — Brooks Kushman P.C.

(57) ABSTRACT

A display motherboard and a manufacturing method thereof are provided. The display motherboard includes a first substrate and a second substrate that are assembled, a plurality of mutually independent display devices located between the first substrate and the second substrate, a first seal, and a second seal. The first seal is provided in a peripheral area of the display motherboard, the second seal is provided in a cutting area of the display motherboard, the (Continued)

cutting area is located around each of the display devices, and the second seal surrounds at least one of the display devices.

15 Claims, 4 Drawing Sheets

(56) References Cited

U.S. PATENT DOCUMENTS

| | | | |
|---|---|---|---|
| 2015/0144907 A1* | 5/2015 | Lin | H01L 51/56 438/34 |
| 2015/0340661 A1* | 11/2015 | Sakamoto | G02F 1/133351 438/28 |
| 2016/0037639 A1* | 2/2016 | Oh | H05K 1/144 361/784 |
| 2016/0254175 A1* | 9/2016 | Yang | H01L 21/6838 29/407.09 |
| 2016/0293886 A1 | 10/2016 | Yu et al. | |
| 2016/0307922 A1* | 10/2016 | Kim | H01L 51/524 |
| 2017/0040568 A1 | 2/2017 | Bai et al. | |
| 2017/0054104 A1* | 2/2017 | Go | H01L 51/5246 |
| 2017/0153472 A1* | 6/2017 | Go | G02F 1/133351 |
| 2017/0229679 A1* | 8/2017 | Li | H01L 25/048 |
| 2018/0136494 A1 | 5/2018 | You et al. | |
| 2018/0233697 A1* | 8/2018 | Jo | H01L 51/525 |
| 2020/0091459 A1* | 3/2020 | Senoo | H01L 27/3258 |

FOREIGN PATENT DOCUMENTS

| | | |
|---|---|---|
| CN | 104638201 A | 5/2015 |
| CN | 105810098 A | 7/2016 |
| CN | 108511632 A | 9/2018 |
| CN | 208352346 U | 1/2019 |
| KR | 1020060081587 A | 7/2006 |
| KR | 1020130025113 A | 3/2013 |

* cited by examiner

DISPLAY MOTHERBOARD AND MANUFACTURING METHOD THEREOF

CROSS-REFERENCE TO RELATED APPLICATION APPLICATIONS

This application is the U.S. national phase of PCT Application No. PCP/CN2019/090545 filed on Jun. 10, 2019, which claims priority to Chinese Patent Application No. 201810597137.8 filed on Jun. 11, 2018, which are incorporated herein by reference in their entireties.

TECHNICAL FIELD

The present disclosure relates to the field of display technology, in particular to a display motherboard and a manufacturing method thereof.

BACKGROUND

The organic light-emitting diode (OLED) display technology is a novel flat panel display technology. It is drawing more and more attention due to characteristics such as active light emission, high luminance, high resolution, wide viewing angle, fast response, low energy consumption, and flexibility, and may become the next-generation display technology taking the place of liquid crystal display.

SUMMARY

The present disclosure provides in some embodiments a display motherboard, including a first substrate and a second substrate that are assembled, a plurality of mutually independent display devices located between the first substrate and the second substrate, a first seal, and a second seal, where the first seal is provided in a peripheral area of the display motherboard, the second seal is provided in a cutting area of the display motherboard, the cutting area is located around each of the display devices, and the second seal surrounds at least one of the display devices.

In some embodiments of the present disclosure, the display motherboard further includes:

a blocking pattern, located in the cutting area, where the blocking pattern forms a sealing area in the cutting area, the second seal is formed in the sealing area, and an orthographic projection of the sealing area onto the first substrate and an orthographic projection of a cut line in the cutting area onto the first substrate do not overlap.

In some embodiments of the present disclosure, an orthographic projection of the blocking pattern onto the first substrate and the orthographic projection of the cut line in the cutting area onto the first substrate do not overlap.

In some embodiments of the present disclosure, the blocking pattern includes a first wall-like sub-pattern and a second wall-like sub-pattern, and the sealing area is formed between the first wall-like sub-pattern and the second wall-like sub-pattern.

In some embodiments of the present disclosure, the blocking pattern includes a plurality of mutually independent spacers, and the sealing area is formed between the plurality of spacers.

In some embodiments of the present disclosure, each of the display devices includes a first spacer, and the plurality of spacers and the first spacer are provided in the same layer and are made of the same material.

In some embodiments of the present disclosure, every two adjacent spacers of the plurality of spacers have a same spacing distance.

In some embodiments of the present disclosure, the cut line in the cutting area includes first cut lines and stick cut lines, the first cut lines correspond to the display devices in a one-to-one manner and surround corresponding display devices respectively, the stick cut lines are located between adjacent first cut lines of the first cut lines and extend in a direction parallel to a side of the first cut lines, and the sealing area is located between the first cut lines and the stick cut lines.

In some embodiments of the present disclosure, the sealing area is provided between the first cut lines and the stick cut lines.

In some embodiments of the present disclosure, a width of the cutting area in a direction perpendicular to the cut line is greater than or equal to 7.2 mm, and a width of the second seal in the direction perpendicular to the cut line is less than or equal to 2.6 mm.

In some embodiments of the present disclosure, each of the display devices includes at least one functional film layer and a cell seal surrounding the at least one functional film layer, and the cell seal is provided in an encapsulating area of each of the display devices.

In some embodiments of the present disclosure, each of the display devices is an OLED display device.

The present disclosure provides in some embodiments a manufacturing method of any one of aforementioned display motherboards, including:

providing a first substrate and a second substrate, where a plurality of mutually independent display devices are formed on the first substrate;

forming a first seal in a peripheral area of the first substrate, and forming a second seal in a cutting area around at least one of the display devices, where the second seal surrounds the at least one of the display devices; and assembling the first substrate and the second substrate.

In some embodiments of the present disclosure, before the second seal is formed, the manufacturing method further includes:

forming a blocking pattern in the cutting area, where the display motherboard further includes the blocking pattern, the blocking pattern forms a sealing area in the cutting area, the second seal is formed in the sealing area, and an orthographic projection of the sealing area onto the first substrate and an orthographic projection of a cut line in the cutting area onto the first substrate do not overlap.

In some embodiments of the present disclosure, the forming the second seal in the cutting area around the at least one of the display devices includes:

forming the second seal in the sealing area.

In some embodiments of the present disclosure, the forming the blocking pattern in the cutting area includes:

forming a first wall-like sub-pattern and a second wall-like sub-pattern in the cutting area, where the sealing area is formed between the first wall-like sub-pattern and the second wall-like sub-pattern.

In some embodiments of the present disclosure, the forming the blocking pattern in the cutting area includes:

forming a plurality of mutually independent spacers in the cutting area, where the sealing area is formed between the plurality of spacers.

BRIEF DESCRIPTION OF THE DRAWINGS

The accompanying drawings described herein are used to provide an understanding of the present disclosure and constitute a part of the present disclosure, and the exemplary embodiments of the present disclosure and the description thereof are used to explain the present disclosure and do not constitute an improper limitation on the present disclosure. In the accompanying drawings.

DETAILED DESCRIPTION

A display motherboard and a manufacturing method thereof provided in some embodiments of the present disclosure are described below in detail with reference to the accompanying drawings of the specification.

In the related art, during the manufacturing of an OLED display device, to improve production efficiency, a motherboard of OLED display devices is usually manufactured first, and then the motherboard is cut to obtain a plurality of OLED display devices. The manufacturing of the motherboard of OLED display devices usually includes the following process: at least one functional film layer of the OLED display device is manufactured on a base substrate; then a cell seal is manufactured in the peripheral area (that is, an encapsulating area of the OLED display device) of the at least one functional film layer of each OLED display device, the cell seal is usually a frit; next, a seal is manufactured in the peripheral area of the base substrate; then the base substrate is assembled with a cover plate, all the OLED display devices formed on the base substrate are sealed by means of the seal located in the peripheral area of the base substrate; finally, the cell seal corresponding to each OLED display device is cured by using a laser sealing process, so that the functional film layer of each OLED display device is sealed by corresponding cell seal, to complete the manufacture of the motherboard of OLED display devices.

It can be seen from the foregoing manufacturing process that because the cell seal is cured at last, to protect the functional film layer in the OLED display device from the impact of external moisture and oxygen, a seal is manufactured in the peripheral area of the motherboard. For example, an ultraviolet (UV)-curing glue is used to perform initial encapsulation of an OLED motherboard.

If there is a foreign object in a cell of the OLED motherboard during initial encapsulation, the UV-curing glue tends to be breached by gas, and as a result the entire motherboard is discarded, leading to a reduced yield of OLED devices.

As discussed above, the seal cannot provide an adequate sealing effect.

In the following embodiments of the present disclosure, a seal is manufactured inside the motherboard, that is, in a cutting area located between at least two OLED display devices. The seal is used to implement secondary protection of the OLED display devices.

Figure 1:
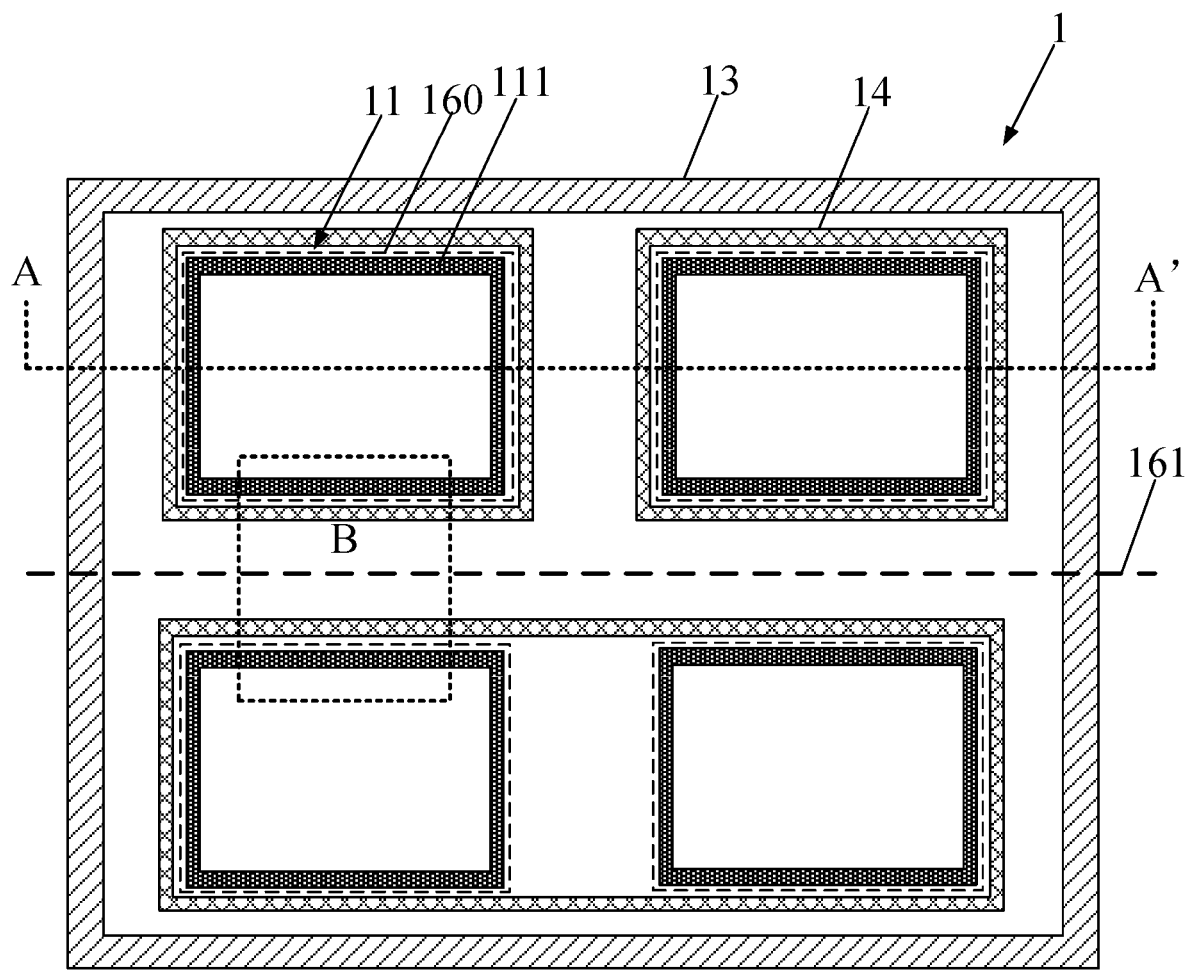
FIG. 1 is a schematic structural diagram of a display motherboard according to some embodiments of the present disclosure.
Figure 2:
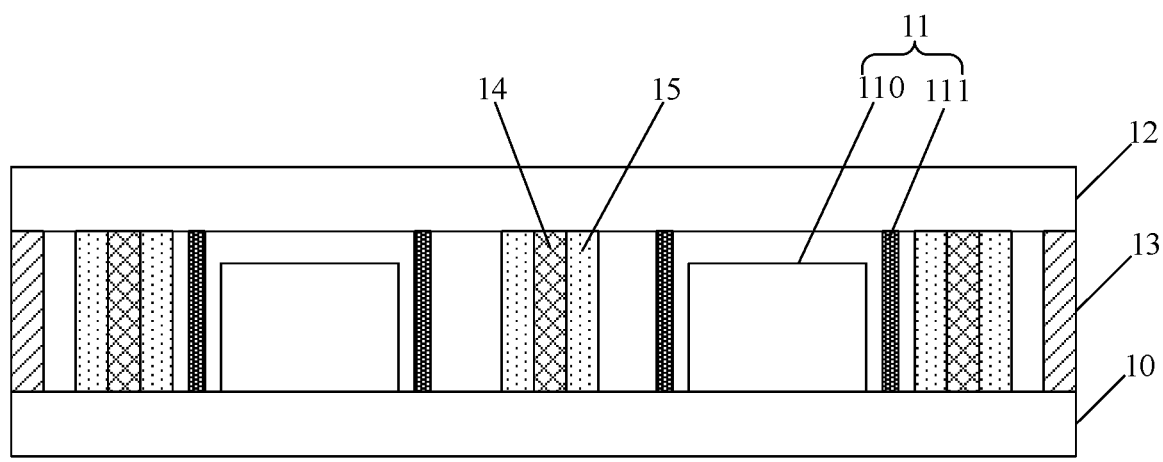
FIG. 2 is a schematic sectional view, along a sectional line AA', of a display motherboard according to some embodiments of the present disclosure.

Referring to FIG. 1 and FIG. 2, the present disclosure provides in some embodiments a display motherboard 1, including a first substrate 10 and a second substrate 12 that are assembled, a plurality of mutually independent display devices 11 located between the first substrate 10 and the second substrate 12, a first seal 13, and a second seal 14. In a peripheral area of the display motherboard 1, the first substrate 10 and the second substrate 12 are sealed by the first seal 13. The display motherboard 1 further includes a cutting area around the display devices 11. The second seal 14 is provided in the cutting area. The second seal 14 surrounds at least one of the display devices 11. The second seal 14 is provided to seal the at least one of the display devices 11. In some embodiments of the present disclosure, the display motherboard 1 includes the first substrate 10 and the second substrate 12 that are assembled, and the plurality of mutually independent display devices 11 are provided between the first substrate 10 and the second substrate 12. Each of the display devices 11 includes a functional film layer 110 and a cell seal 111 surrounding the functional film layer 110. The cell seal 111 is provided in an encapsulating area of each OLED display device.

In some embodiments of the present disclosure, the plurality of display devices 11 are distributed in an array, and a cutting area is formed between adjacent display devices 11.

In some embodiments of the present disclosure, during manufacture process of the display motherboard 1, the second seal 14 is manufactured in the cutting area at the same time as the first seal 13 located in the peripheral area of the display motherboard 1 is manufactured.

A distribution position of the second seal 14 is set according to a practical requirement.

For example, the second seal 14 may enclose a plurality of closed areas, and one or more display devices 11 are included in each closed area.

The first seal 13 and the second seal 14 come in diverse kinds. For example, both the first seal 13 and the second seal 14 are UV-curing glues, but the present disclosure is not limited thereto.

In some embodiments of the present disclosure, during cutting of the display motherboard 1, the display motherboard 1 is cut into a plurality of subboards. Each subboard is cut to split the display device 11 from each subboard.

For example, when there are N rows of display devices 11 on the motherboard, the display motherboard 1 is cut into N subboards. Each subboard corresponds to one row of display devices 11. Each subboard is cut to cut off the cutting area around each subboard, to obtain individual display devices 11.

In some embodiments, during cutting of the display motherboard 1 to obtain the display devices 11, the cutting area on the motherboard are all cut off. Accordingly, the first seal 13 formed in the peripheral area of the motherboard and the second seal 14 formed in the cutting area are all cut off.

As can be known from the structure and cutting process of the display motherboard 1, the display motherboard 1 provided in the foregoing embodiment of the present disclosure includes the first seal 13 located in the peripheral area of the display motherboard 1 and the second seal 14 located in the cutting area around at least one display device 11. The two seals can implement double protection of the display devices 11 included in the display motherboard 1. That is, when the first seal 13 is breached, the second seal 14 can still protect the display devices 11, to prevent the functional film layer 110 in the display devices 11 from being eroded by moisture and oxygen, thereby ensuring a better yield of the display devices 11.

Because the second seal 14 is manufactured in the cutting area of the display motherboard 1, when the display motherboard 1 is subsequently cut to obtain the display devices 11, the second seal 14 in the cutting areas is cut off completely. Therefore, the second seal 14 neither affects the light-emission efficiency of the display devices 11 nor affects a bezel width of the display devices 11. Therefore, the display motherboard 1 provided in the foregoing embodiment of the present disclosure can prevent the display devices 11 from being eroded by moisture and oxygen without causing any impact to the display devices 11, thereby ensuring a better yield of the display devices 11.

In some embodiments, as shown in FIG. 2 and FIG. 3A to FIG. 3C, the display motherboard 1 further includes a blocking pattern 15 located in the cutting area. The blocking pattern 15 forms a sealing area in the cutting area. The second seal 14 is formed in the sealing area. An orthographic projection of the sealing area onto the first substrate 10 and an orthographic projection of a cut line 16 in the cutting area onto the first substrate 10 do not overlap.

The blocking pattern 15 is formed in the cutting area. The blocking pattern 15 defines the sealing area in the cutting area, and the orthographic projection of the sealing area onto the first substrate 10 and the orthographic projection of the cut line 16 in the cutting area onto the first substrate 10 do not overlap. In this way, when the second seal 14 is manufactured subsequently, the second seal 14 may be formed in the sealing area, so that the second seal 14 does not cover the cut line 16 in the cutting area. Therefore, by providing the blocking pattern 15 in the cutting area, and defining, with the blocking pattern 15, the sealing area used for forming the second seal 14, the second seal 14 can be prevented from being compressed and scattered to the cut line 16 or from spreading to an edge of the cell seal 111 of the display device 11 when the first substrate 10 and the second substrate 12 are assembled.

Therefore, the second seal 14 in the display motherboard 1 provided in the foregoing embodiment not only ensures a better yield of the display devices 11, but also prevents the second seal 14 from affecting a subsequent cutting process, and avoids impact on a subsequent laser sealing process (frit laser sealing) performed on the cell seal 111 (frit glue) of the display device 11.

In some embodiments, an orthographic projection of the blocking pattern 15 onto the first substrate 10 and the orthographic projection of the cut line 16 in the cutting area onto the first substrate 10 do not overlap.

Specifically, it may be provided that the orthographic projection of the blocking pattern 15 onto the first substrate 10 and the orthographic projection of the cut line in the cutting area onto the first substrate 10 do not overlap. In this way, the blocking pattern 15 does not cover the cut line in the cutting area. Therefore, in the display motherboard 1 provided in the foregoing embodiment, not only the introduced blocking pattern 15 defines a flowing area of the second seal 14 better, but also the blocking pattern 15 is prevented from affecting the subsequent cutting process, and impact on a subsequent laser sealing process (frit laser sealing) performed on the cell seal 111 (frit glue) of the display device 11 is avoided.

The blocking pattern 15 provided in the foregoing embodiment may have various structures.

Figure 3A:
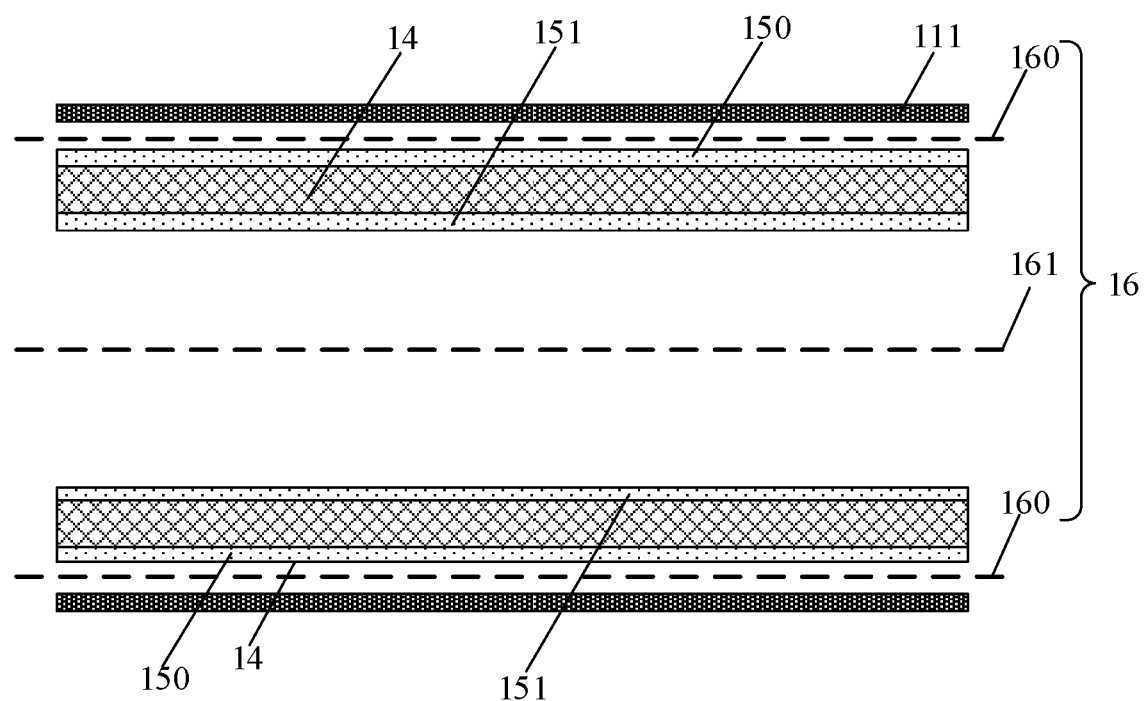
FIG. 3A is a top view of an area B of a display motherboard according to some embodiments of the present disclosure.

In some embodiments of the present disclosure, as shown in FIG. 3A, the blocking pattern 15 includes a first wall-like sub-pattern 150 and a second wall-like sub-pattern 151, and the sealing area is formed between the first wall-like sub-pattern 150 and the second wall-like sub-pattern 151.

By providing the blocking pattern 15 including the first wall-like sub-pattern 150 and the second wall-like sub-pattern 151 that are disposed opposite to each other, and forming the sealing area between the two wall-like sub-patterns, the second seal 14 in the sealing area does not spread to an area other than the sealing area during assembling the first substrate 10 and the second substrate 12, thereby better preventing the second seal 14 from affecting a subsequent cutting process, and avoiding impact on a subsequent laser sealing process (frit laser sealing) performed on the cell seal 111 (frit glue) of the display device 11.

Figure 3B:
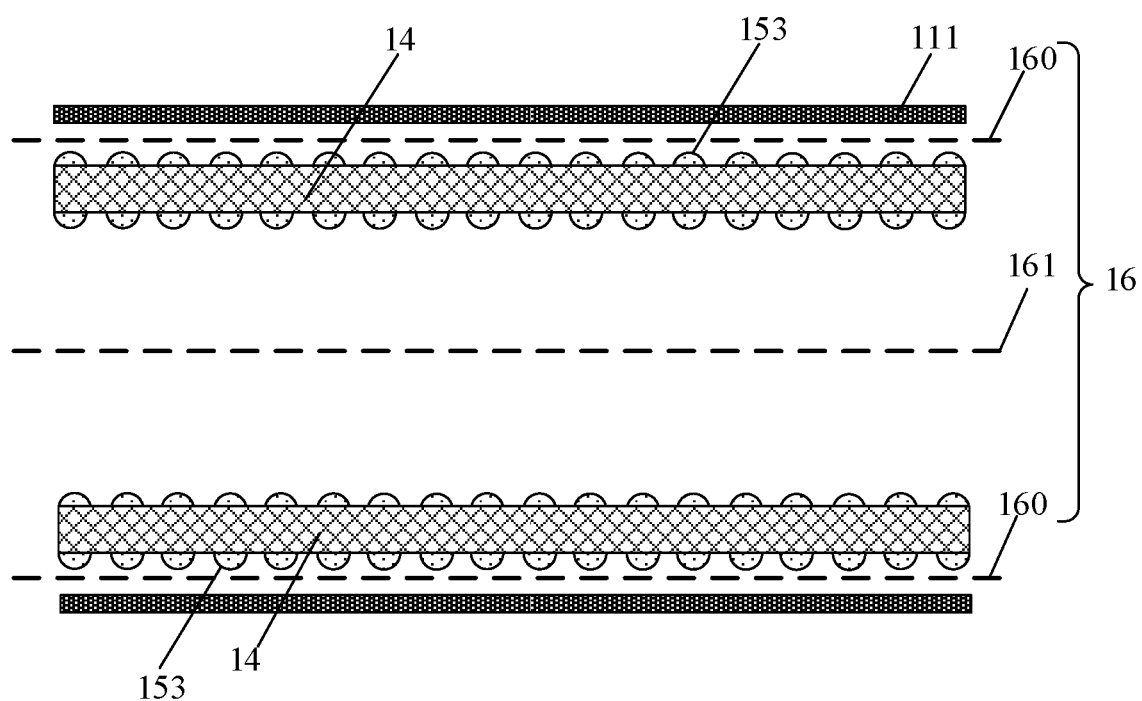
FIG. 3B is another top view of an area B of a display motherboard according to some embodiments of the present disclosure.

In some other embodiments of the present disclosure, as shown in FIG. 3B, the blocking pattern 15 includes a plurality of mutually independent spacers 153, and the sealing area is defined between the plurality of spacers 153.

By providing the plurality of spacers 153 as the blocking pattern 15, and forming the sealing area between the plurality of spacers 153, the plurality of spacers 153 can block the second seal 14 formed in the sealing area, to prevent the second seal 14 from spreading to the cut line 16 or an edge of the display device 11.

In some embodiments of the present disclosure, every two adjacent spacers of the plurality of spacers 153 have a same spacing distance.

By providing a same spacing distance between every two adjacent spacers 153, the second seal 14 can spread uniformly during the assembly of the first substrate 10 and the second substrate 12, thereby ensuring the sealing performance of the second seal 14.

In some embodiments of the present disclosure, as shown in FIG. 3B, the blocking pattern 15 includes a plurality of mutually independent spacers 153, the plurality of spacers 153 are arranged in two rows, the sealing area is defined between the two rows of spacers 153, and there is an equal spacing distance between every two adjacent spacers in each row. In some embodiments of the present disclosure, the plurality of mutually independent spacers included in the blocking pattern 15 and spacers in the display devices 11 are provided in the same layer and are made of the same material.

Since the plurality of spacers 153 and the spacers in the display devices 11 are provided in the same layer and are made of the same material, a single patterning process can be used to manufacture the spacers in the display devices 11 and the spacers 153 included in the blocking pattern 15 at the same time, thereby avoiding an additional process for manufacturing the spacers 153 included in the blocking pattern 15 and simplifying the manufacturing process of the display motherboard 1.

In some embodiments of the present disclosure, as shown in FIG. 3A, the blocking patterns 15 around the plurality of display devices all include a first wall-like sub-pattern 150 and a second wall-like sub-pattern 151.

In some embodiments of the present disclosure, as shown in FIG. 3B, the blocking patterns 15 around the plurality of display devices all include spacers 153.

Figure 3C:
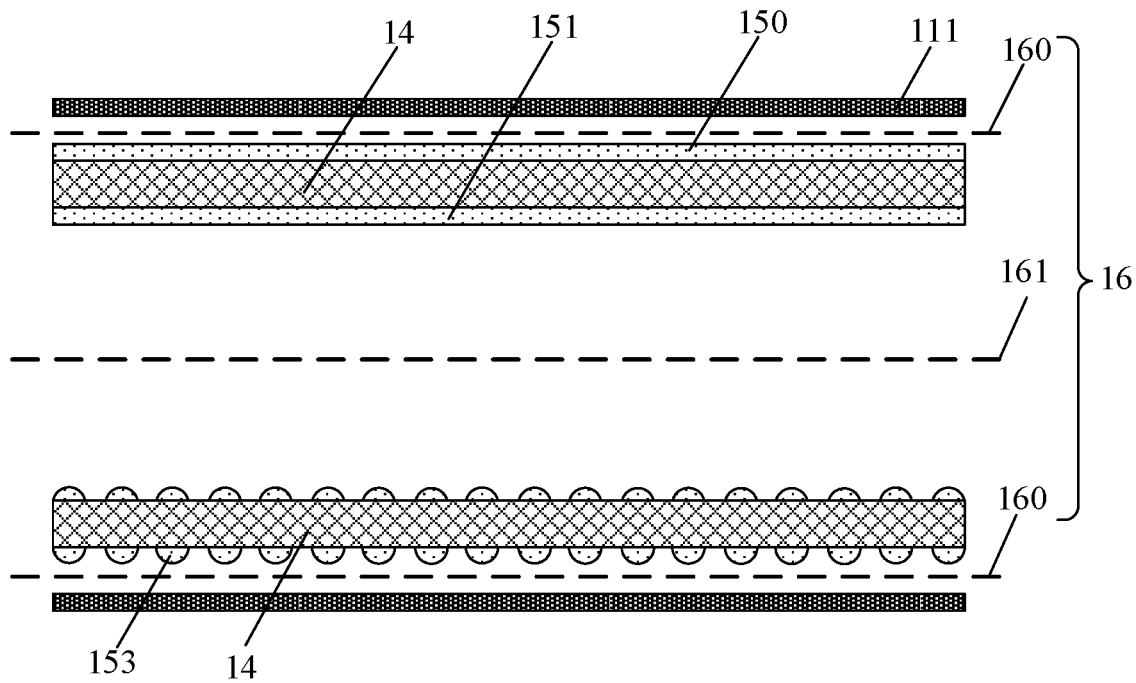
FIG. 3C is yet another top view of an area B of a display motherboard according to some embodiments of the present disclosure.

In some embodiments of the present disclosure, as shown in FIG. 3C, some blocking patterns 15 include a first wall-like sub-pattern 150 and a second wall-like sub-pattern 151, and some other blocking patterns 15 include spacers 153.

In some embodiments, as shown in FIG. 3A to FIG. 3C, the cut line 16 in the cutting area includes first cut lines 160 and stick cut lines 161. The first cut lines 160 correspond to the display devices 11 in a one-to-one manner and surround the corresponding display devices 11 respectively. Each of the stick cut lines 161 is located between adjacent first cut lines of the first cut lines 160 and extends in a direction parallel to a side of the first cut lines 160, and the sealing area is located between the first cut lines 160 and the stick cut lines 161.

In some embodiments, during cutting of the display motherboard 1, the display motherboard 1 is cut along the stick cut lines 161 into a plurality of subboards, and then the subboards are cut along the first cut line 160 (which is also referred to as cell cut line) corresponding to each of the display devices 11, to split the corresponding display device 11.

For example, as shown in FIG. 1, in the display motherboard 1, the display devices 11 are distributed in an array, the display devices 11 are of a rectangular shape, and each corresponding first cut line 160 surrounding a display device 11 forms a rectangle.

There are various distribution manners and extension directions of the stick cut lines 161. For example, a stick cut line 161 is provided between adjacent first cut lines 160 and extends in the direction parallel to one side of the first cut lines 160.

For example, as shown in FIG. 1, it is provided that two sides of the first cut line 160 are parallel to a horizontal direction, and the other two sides are parallel to a vertical direction. In addition, it is provided that the stick cut lines 161 extend in the horizontal direction, and a quantity of the stick cut lines 161 is equal to a quantity of rows of the display devices 11 distributed on the display motherboard 1 minus 1.

For another example, it is provided that the stick cut lines 161 extend in the vertical direction, and a quantity of the stick cut lines 161 is equal to a quantity of columns of the display devices 11 distributed on the display motherboard 1 minus 1.

In some embodiments of the present disclosure, as shown in FIG. 3A to FIG. 3C, when there are both the first cut lines 160 and the stick cut lines 161 in the cutting area, the sealing area is disposed between the first cut lines 160 and the stick cut lines 161.

Since the sealing area is formed between the first cut lines 160 and the stick cut lines 161, the second seal 14 formed in the sealing area is prevented from being compressed and scattered to the cut line or the edge of the cell seal 111 of the display device 11 during the lamination of the first substrate 10 and the second substrate 12, thereby preventing the second seal 14 from affecting a subsequent cutting process, and avoiding impact on a subsequent laser sealing process performed on the cell seal 111 of the display device 11.

The width of the cutting area in the display motherboard 1 and the width of the second seal 14 formed in the cutting area may be set according to a practical requirement. For example, it is provided that the width of the cutting area in a direction perpendicular to the cut line is greater than or equal to 7.2 mm, and the width of the second seal 14 in the direction perpendicular to the cut line is less than or equal to 2.6 mm.

By setting the width of the cutting area in the direction perpendicular to the cut line to be greater than or equal to 7.2 mm, and setting the width of the second seal 14 in the direction perpendicular to the cut line to be less than or equal to 2.6 mm, not only adequate sealing performance of the second seal 14 is ensured, but also a sufficiently wide blank area is provided in the cutting area, in addition to the sealing area for forming the second seal 14, so that a cutting yield is ensured during cutting of the display motherboard 1.

In some embodiments of the present disclosure, the width of the cutting area in the direction perpendicular to the cut line is set to 7.2 mm, and the width of the second seal 14 in the direction perpendicular to the cut line is set to 2.6 mm.

In this way, not only an adequate sealing performance of the second seal 14 can be ensured, but also the utilization of the display motherboard 1 can be improved.

In some embodiments of the present disclosure, during manufacturing of the second seal 14, the second seal 14 having a width of 0.45 mm in the direction perpendicular to the cut line is applied in the sealing area. In the process of laminating the first substrate 10 and the second substrate 12, the second seal 14 spreads to eventually form the second seal 14 having a width of 2.6 mm in the direction perpendicular to the cut line.

The present disclosure provides in some embodiments a manufacturing method of the display motherboard 1 provided in any one of foregoing embodiments.

Figure 4:
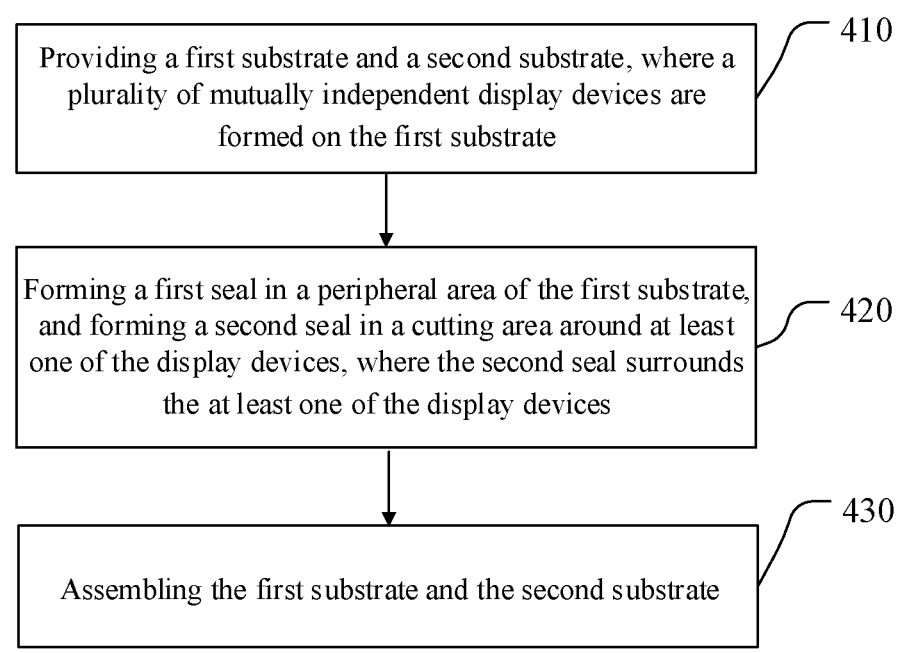
FIG. 4 is a flowchart of a manufacturing method of a display motherboard according to some embodiments of the present disclosure.

As shown in FIG. 4, the manufacturing method of a display motherboard includes a step 410, a step 420, and a step 430.

The step 410 includes: providing a first substrate 10 and a second substrate 12, where a plurality of mutually independent display devices 11 are formed on the first substrate 10.

The step 420 includes: forming a first seal 13 in the peripheral area of the first substrate 10, and forming a second seal 14 in a cutting area around at least one of the display devices 11, where the second seal 14 surrounds the at least one of the display devices 11.

The step 430 includes: assembling the first substrate 10 and the second substrate 12.

By assembling the first substrate 10 and the second substrate 12, sealing of all the display devices 11 by the first seal 13 and sealing of at least one of the display devices 11 by the second seal 14 are achieved.

The plurality of mutually independent display devices 11 are manufactured on the first substrate 10 by using a process in the related art. Each of the display devices 11 includes a functional film layer 110 and a cell seal 111 surrounding the functional film layer 110.

For example, as shown in FIG. 1, the plurality of display devices 11 are distributed in an array, and a cutting area is formed between adjacent display devices 11. During manufacturing of the display motherboard 1, the second seal 14 are manufactured in the cutting area while the first seal 13 located in the peripheral area of the display motherboard 1 is manufactured. A distribution position of the second seal 14 may be set according to a practical requirement. For example, the second seal 14 encloses a plurality of closed areas, and one or more display devices 11 are included in each closed area. The first substrate 10 and the second substrate 12 are assembled, to implement sealing of all the display devices 11 by the first seal 13 and sealing of the at least one of the display devices 11 by the second seal 14, to complete the manufacture of the display motherboard 1.

In some embodiments of the present disclosure, during cutting of the display motherboard 1 manufactured in the foregoing manufacturing method, the display motherboard 1 is cut into a plurality of subboards. Each subboard is then cut to split the display devices 11 from each subboard.

For example, when there are N rows of display devices 11 on the motherboard, the display motherboard 1 is cut into N subboards. Each subboard corresponds to one row of display devices 11. Each subboard is then cut to cut off the cutting area around each subboard, to obtain individual display devices 11.

In some embodiments of the present disclosure, during cutting the display motherboard 1 to obtain the display devices 11, the cutting area on the display motherboard 1 is cut off completely. Accordingly, the first seal 13 formed in the peripheral area of the motherboard and the second seal 14 formed in the cutting areas are all cut off.

The display motherboard 1 manufactured in the manufacturing method provided in the foregoing embodiment of the present disclosure includes the first seal 13 located in the peripheral area of the display motherboard 1 and the second seal 14 located in the cutting area around at least one display device 11. The two seals can implement double protection of the display devices 11 included in the display motherboard 1. For example, when the first seal 13 is breached, the second seal 14 can still protect the display devices 11, to prevent the functional film layer 110 in the display devices 11 from being eroded by moisture and oxygen, thereby ensuring a better yield of the display devices 11.

The second seal 14 is manufactured in the cutting area of the display motherboard 1, so that when the display motherboard 1 is subsequently cut to obtain the display devices 11, the second seal 14 in the cutting area is cut off completely. Therefore, the second seal 14 neither affects the light-emission efficiency of the display devices 11 nor affects a bezel width of the display devices 11. Therefore, the display motherboard 1 manufactured in the manufacturing method provided in the foregoing embodiment of the present disclosure can prevent the display devices 11 from being eroded by moisture and oxygen without causing any impact to the display devices 11, thereby ensuring a better yield of the display devices 11.

In some embodiments of the present disclosure, before the second seal 14 is formed, the manufacturing method provided in the foregoing embodiment further includes:

forming a blocking pattern 15 in the cutting area, where the blocking pattern 15 forms a sealing area in the cutting area, the second seal 14 is formed in the sealing area, and an orthographic projection of the sealing area onto the first substrate 10 and an orthographic projection of a cut line 16 in the cutting area onto the first substrate 10 do not overlap.

In some embodiments of the present disclosure, the step of forming the second seal 14 in the cutting area around the at least one of the display devices 11 includes: forming the second seal 14 in the sealing area.

Since the blocking pattern 15 is formed in the cutting area so that the blocking pattern 15 defines the sealing area in the cutting area and the orthographic projection of the sealing area onto the first substrate 10 and the orthographic projection of the cut line in the cutting area onto the first substrate 10 do not overlap, the second seal 14 may be directly formed in the sealing area when the second seal 14 is manufactured subsequently, and the second seal 14 does not cover the cut line in the cutting area. Therefore, in the manufacturing method provided in the foregoing embodiment, by providing the blocking pattern 15 in the cutting area, and defining, by means of the blocking pattern 15, the sealing area used for forming the second seal 14, the second seal 14 can be prevented from being compressed and scattered to the cut line or from further spreading to an edge of the cell seal 111 of the display device 11 when the first substrate 10 and the second substrate 12 are assembled.

Therefore, the second seal 14 in the display motherboard 1 manufactured in the manufacturing method provided in the foregoing embodiment ensures a better yield of the display devices 11, and the second seal 14 is prevented from affecting a subsequent cutting process, and impact on a subsequent laser sealing process performed on the cell seal 111 of the display device 11 is avoided.

In some embodiments of the present disclosure, during manufacturing of the blocking pattern 15, an orthographic projection of the blocking pattern 15 onto the first substrate 10 and the orthographic projection of the cut line 16 in the cutting area onto the first substrate 10 do not overlap.

In this way, the blocking pattern 15 does not cover the cut line in the cutting area, therefore not only the blocking pattern 15 defines a flowing area of the second seal 14 better, but also the blocking pattern 15 is prevented from affecting the subsequent cutting process, and impact on a subsequent laser sealing process performed on the cell seal 111 of the display device 11 is avoided.

The manufactured blocking pattern 15 may have various structures. For example, a first wall-like sub-pattern 150 and a second wall-like sub-pattern 151 are formed. The blocking pattern 15 includes the first wall-like sub-pattern 150 and the second wall-like sub-pattern 151, and the sealing area is defined between the first wall-like sub-pattern 150 and the second wall-like sub-pattern 151.

For another example, the plurality of mutually independent spacers 153 are manufactured. The blocking pattern 15 includes a plurality of mutually independent spacers 153, and the sealing area is defined between the plurality of spacers 153. The spacers 153 and spacers in the display devices 11 are provided in the same layer and are made of the same material.

In some embodiments of the present disclosure, every two adjacent spacers of the plurality of formed spacers have a same spacing distance.

In some embodiments, the cut line in the cutting area of the display motherboard 1 manufactured in the foregoing manufacturing method includes first cut lines 160 and stick cut lines 161. The first cut lines 160 correspond to the display devices 11 in a one-to-one manner and surround the corresponding display devices 11 respectively. Each of the stick cut lines 161 is located between adjacent first cut lines of the first cut lines 160 and extends in a direction parallel to a side of the first cut lines 160, and the sealing area is located between the first cut lines 160 and the stick cut lines 161.

The width of the cutting area in the display motherboard 1 manufactured in the foregoing manufacturing method and the width of the second seal 14 formed in the cutting area may be set according to a practical requirement. For example, it may be provided that the width of the cutting area in a direction perpendicular to a cut line is greater than or equal to 7.2 mm, and the width of the second seal 14 in the direction perpendicular to the cut line is less than or equal to 2.6 mm.

Unless otherwise defined, the technical terms and scientific terms used in the present disclosure have the same meaning as how they are generally understood by those of ordinary skill in the art to which the present disclosure pertains. Terms such as "first" and "second" used in the present disclosure are only used to distinguish different components and do not intend to indicate any order, number or importance. A term such as "including" or "includes" is intended to mean that an element or object preceding the term covers elements or objects listed behind the term, but do not exclude other elements or objects. A term such as "connection" or "connected" is not limited to a physical or mechanical connection, and may include an electrical connection, no matter direct or indirect. "Up", "down", "left", "right", and the like are only used to represent a relative position relationship. The relative position relationship may change correspondingly after the absolute position of described object changes.

It may be understood that when an element such as a layer, a film, an area or a substrate is located "on" or "under" another element, the element may be "directly" located "on" or "under" the another element or there may be an intervening element.

In the description of the foregoing embodiments, specific features, structures, materials or characteristics may be combined in an appropriate manner in any one or more embodiments or examples.

The foregoing descriptions are merely some implementations of the present disclosure, and are not intended to limit the scope of the present disclosure. A person skilled in the art may readily come up with variations or replacements within the technical scope disclosed in the present disclosure.

What is claimed is:

1. A display motherboard, comprising a first substrate and a second substrate that are assembled, a plurality of mutually independent display devices located between the first substrate and the second substrate, a first seal, a second seal, and a blocking pattern located in a cutting area of the display motherboard,
   wherein the first seal is provided in a peripheral area of the display motherboard, the second seal is provided in the cutting area of the display motherboard, the cutting area is located around each of the display devices, and the second seal surrounds at least one of the display devices,
   wherein the blocking pattern forms a sealing area in the cutting area, the second seal is formed in the sealing area, and an orthographic projection of the sealing area onto the first substrate and an orthographic projection of a cut line in the cutting area onto the first substrate do not overlap,
   wherein the blocking pattern is arranged on both sides of the second seal.

2. The display motherboard according to claim 1, wherein an orthographic projection of the blocking pattern onto the first substrate and the orthographic projection of the cut line in the cutting area onto the first substrate do not overlap.

3. The display motherboard according to claim 1, wherein the blocking pattern comprises a first wall-like sub-pattern and a second wall-like sub-pattern, and the sealing area is formed between the first wall-like sub-pattern and the second wall-like sub-pattern.

4. The display motherboard according to claim 1, wherein the blocking pattern comprises a plurality of mutually independent spacers, and the sealing area is formed between the plurality of spacers.

5. The display motherboard according to claim 4, wherein each of the display devices comprises at least one first spacer, and the plurality of mutually independent spacers and the at least one first spacer are provided in a same layer and are made of a same material.

6. The display motherboard according to claim 4, wherein every two adjacent spacers of the plurality of mutually independent spacers have a same spacing distance.

7. The display motherboard according to claim 1, wherein the cut line in the cutting area comprises first cut lines and stick cut lines, the first cut lines correspond to the display devices in a one-to-one manner and surround corresponding display devices respectively, each of the stick cut lines is located between adjacent first cut lines of the first cut lines and extends in a direction parallel to a side of the first cut lines, and the sealing area is located between the first cut lines and the stick cut lines.

8. The display motherboard according to claim 7, wherein the sealing area is provided between the first cut lines and the stick cut lines.

9. The display motherboard according to claim 1, wherein a width of the cutting area in a direction perpendicular to the cut line is greater than or equal to 7.2 mm, and a width of the second seal in the direction perpendicular to the cut line is less than or equal to 2.6 mm.

10. The display motherboard according to claim 1, wherein each of the display devices comprises at least one functional film layer and a cell seal surrounding the at least one functional film layer, and the cell seal is provided in an encapsulating area of each of the display devices.

11. The display motherboard according to claim 1, wherein each of the display devices is an organic light-emitting diode (OLED) display device.

12. A manufacturing method of the display motherboard according to claim 1, comprising:
   providing a first substrate and a second substrate, wherein a plurality of mutually independent display devices are formed on the first substrate;
   forming a first seal in a peripheral area of the first substrate;
   forming a blocking pattern in the cutting area, wherein the display motherboard further comprises the blocking pattern, the blocking pattern forms a sealing area in the cutting area, the second seal is formed in the sealing area, and an orthographic projection of the sealing area onto the first substrate and an orthographic projection of a cut line in the cutting area onto the first substrate do not overlap;
   forming a second seal in a cutting area around at least one of the display devices, wherein the second seal surrounds the at least one of the display devices; and
   assembling the first substrate and the second substrate.

13. The manufacturing method according to claim 12, wherein the forming the second seal in the cutting area around the at least one of the display devices further comprises:
   forming the second seal in the sealing area.

14. The manufacturing method according to claim 13, wherein the forming the blocking pattern in the cutting area comprises:
   forming a first wall-like sub-pattern and a second wall-like sub-pattern in the cutting area, wherein the sealing area is formed between the first wall-like sub-pattern and the second wall-like sub-pattern.

15. The manufacturing method according to claim 13, wherein the forming the blocking pattern in the cutting area comprises:
   forming a plurality of mutually independent spacers in the cutting area, wherein the sealing area is formed between the plurality of mutually independent spacers.

* * * * *